United States Patent [19]

Potter et al.

[11] Patent Number: 5,783,261

[45] Date of Patent: Jul. 21, 1998

[54] USING A COATED FUEL INJECTOR AND METHOD OF MAKING

[75] Inventors: Timothy Potter, Dearborn; Marcus W. Fried, Belleville; Ellsworth Schanergerger, Livonia, all of Mich.

[73] Assignee: Ford Global Technologies, Inc., Dearborn, Mich.

[21] Appl. No.: 678,309

[22] Filed: Jul. 11, 1996

[51] Int. Cl.$^6$ .................................................. C23C 14/04
[52] U.S. Cl. .................... 427/526; 204/192.1; 427/249; 427/255.2; 427/331; 427/346; 427/355; 427/399; 427/523; 427/527; 427/528; 427/530; 427/534; 427/535; 427/569; 427/578; 427/585
[58] Field of Search ...................... 204/192.1; 427/523, 427/527, 530, 528, 578, 569, 346, 355, 585, 331, 534, 535, 399, 526, 249, 255.2

[56] References Cited

U.S. PATENT DOCUMENTS 4,554,208   11/1985   MacIver et al. .................. 428/332

OTHER PUBLICATIONS

Synthesis, Properties, and Applications of Superhard Amorphous Coatings Applications of Diamond Films and Related Materials: Third International Conf. 1995 pp. 691–702 & 703–710 (No month avail.).

*Primary Examiner*—Bernard Pianalto
*Attorney, Agent, or Firm*—Joseph W. Malleck

[57] ABSTRACT

A method of using an amorphous carbon-based coating to extend the operating life of a fuel injector having a needle operating within a valve body, the valve body, the valve and body having steel surfaces subject to repeated impact and sliding friction contact over the operating life of the injector. The method comprises (a) providing the steel surfaces of at least one of the needle and body with an ion implanted stabilized amorphous carbon-based coating in a thickness of 1–10 micrometers, the coating having low internal stresses and low coefficient of friction independent of humidity and being stabilized by the presence of up to 30% by weight of carbide forming material selected from the group of silicon, titanium and tungsten, and (b) repeatedly and rapidly actuating the fuel injector in time periods of 0.5–1.5 microseconds for a single acutations thereby subjecting the valve coated surfaces to substantially continuous sliding contact and needle impact forces of 70,000–200,000 psi, the actuation being carried out in the absence of lubricious fuel at the coated surfaces whereby wear is significantly reduced by atomic transfer of coating atoms to mating surfaces during impact or sliding contact.

12 Claims, 3 Drawing Sheets

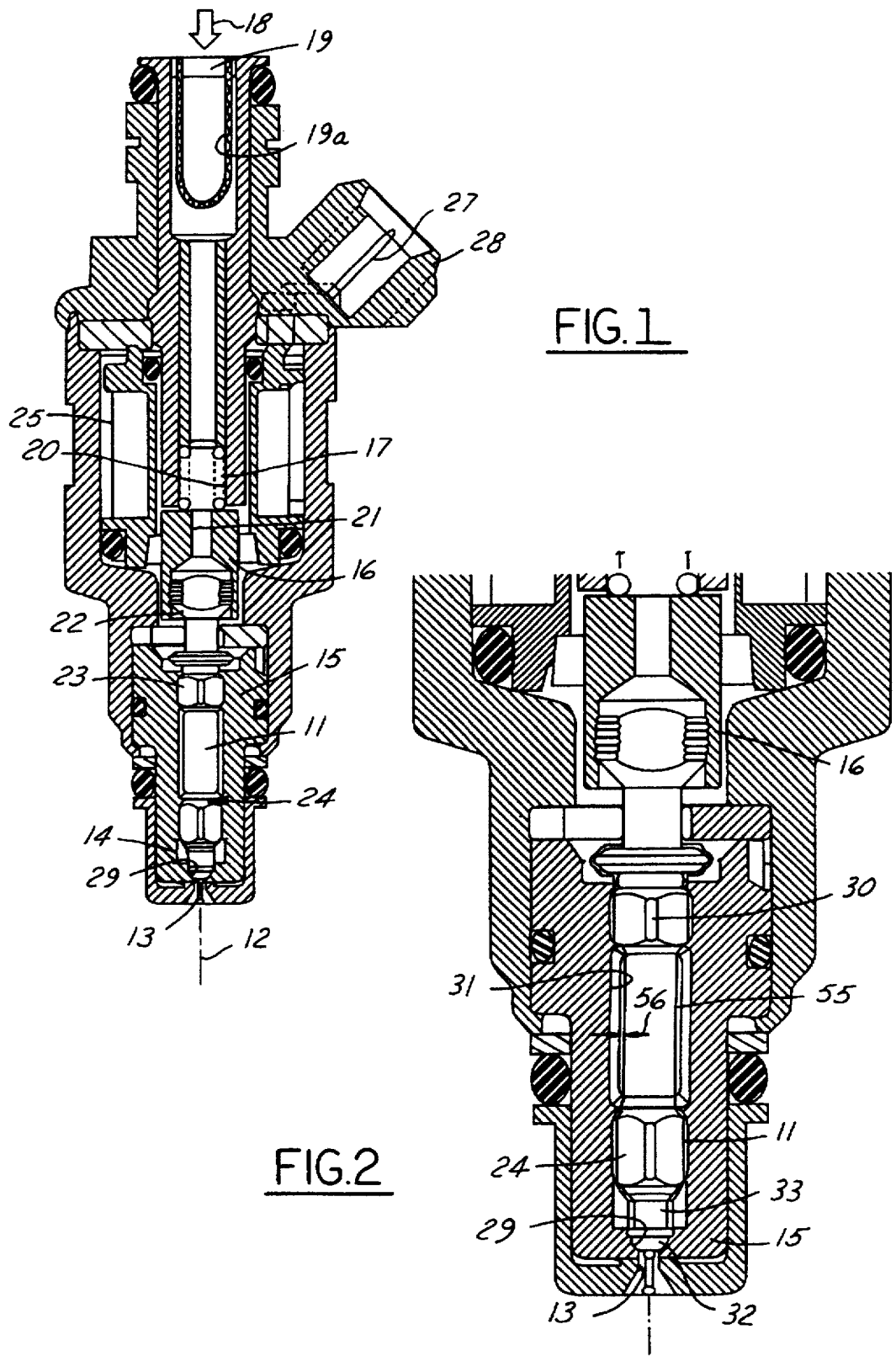

1

USING A COATED FUEL INJECTOR AND METHOD OF MAKING

BACKGROUND OF THE INVENTION

1. Technical Field

This invention relates to the technology of making and using precise metering elements for fuel injectors in a manner so that such injectors are protected against wear and malfunction in the absence of a lubricious fuel.

2. Discussion of the Prior Art

Fuel injectors usually are associated with each cylinder of an internal combustion engine. Each injector has a valve mechanism which opens and closes an exit aperture of a cup containing fuel; the aperture is opened repeatedly for a period of time in synchronization with the cycle of the engine. The fuel metering portion of the injector, usually a needle possessing a pintle valve, has some surfaces which are subject to impact and some surfaces which are subject to sliding contact. In a conventional gasoline engine, these injector surfaces would normally be lubricated by the presence of liquid fuel passing through the injector. If the injector is of the type that does not maintain a lubricating fuel in the metering chamber during prolonged motoring, such as experienced in diesel engines, or is used continuously or alternatively with gaseous fuels (i.e. propane, natural gas, gasoline and diesel fuels with low sulfur content), such impact and sliding surfaces will become unduly hot and will exhibit varying degrees of wear (resulting from material fatigue, deformation and material wear). This will adversely affect injector performance as well as engine performance.

Fuel injector erosion has been addressed in the prior art by the attachment of more wear resistance recessed bodies to the exposed parts of the metering elements. Such bodies have been constituted of special alloyed steel, ceramic or glass. These add-on bodies have not proved commercially desirable because of cost and because they do not necessarily prolong the life of the metering surfaces in the absence of lubrication. In U.S. Pat. No. 5,409,165, the entire valve pintle was made of ceramic or ceramic like material to reduce erosion, but ceramic or wear resistance material is prohibitively expensive to manufacture.

SUMMARY OF THE INVENTION

It is an object of this invention to economically enhance performance of a fuel injector operating with fuels having extremely poor lubricity, such as gaseous fuels; it is also an object of this invention to provide a better method of making an injector that will perform in the absence of lubricious fuels, by coating the impact and sliding contact surfaces of such injector with a material that exhibits high hardness (15–30 knoop), a very low friction coefficient (less than 0.08 and preferably less than 0.04) resulting from the transfer of an outer layer of atoms during wear contact, and has stabilized internal stresses.

The method, in a first aspect, is a method of using an amorphous carbon-based coating to extend the operating life of a fuel injector having a needle operating as a valve within a valve body, the needle and valve body having steel surfaces subject to repeated impact and sliding contact over the operating life of the injector. The method comprises (a) providing the steel surfaces of at least one of the valve and body with an ion implanted stabilized amorphous carbon-based coating in a thickness of 1–10 micrometers, the coating being unaffected by humidity and stabilized by the presence of up to 30% by weight of a carbide forming material selected from the group of silicon, titanium and tungsten, and (b) repeatedly and cyclically actuating the fuel injector needle between open and closed valve positions using a cycle time of 0.5–1.5 milliseconds while subjecting the valve coating surfaces to sliding contact or impact forces, the actuation being carried out in the absence of lubricious fuel at the coated surfaces whereby wear is significantly reduced by atomic transfer of coating atoms to mating surfaces during impact or sliding contact.

The invention, in a second aspect is a method of making a fuel injector with an extended life needle having a needle tip at one end and having impact and sliding contact surfaces not all of which are exposed when viewed from a single direction, comprising (a) positioning the needle on one electrode pedestal of a plasma enhanced vapor deposition apparatus with the needle tip pointing generally to an opposite polarity electrode of the apparatus, any surface of the needle that is not to be surfaced treated being masked; (b) cleaning and etching at least the impact and sliding contact surfaces of the needle; and (c) while providing ionizing material to the opposite polarity electrode, carrying out plasma enhanced vapor deposition to deposit an amorphous carbon coating in a thickness of 1–10 micrometers, the carbon coating being stabilized by the presence of up to 30% by weight of a carbide former with the steel, the carbide former being selected from the group of silicon, titanium and tungsten.

BRIEF DESCRIPTION OF THE DRAWING

FIG. 1 is an enlarged central sectional elevational view of a fuel injector having its needle coated in accordance with this invention;

FIG. 2 is a greatly enlarged view a portion of the injector of FIG. 1;

DETAILED DESCRIPTION AND BEST MODE

Figure 3:
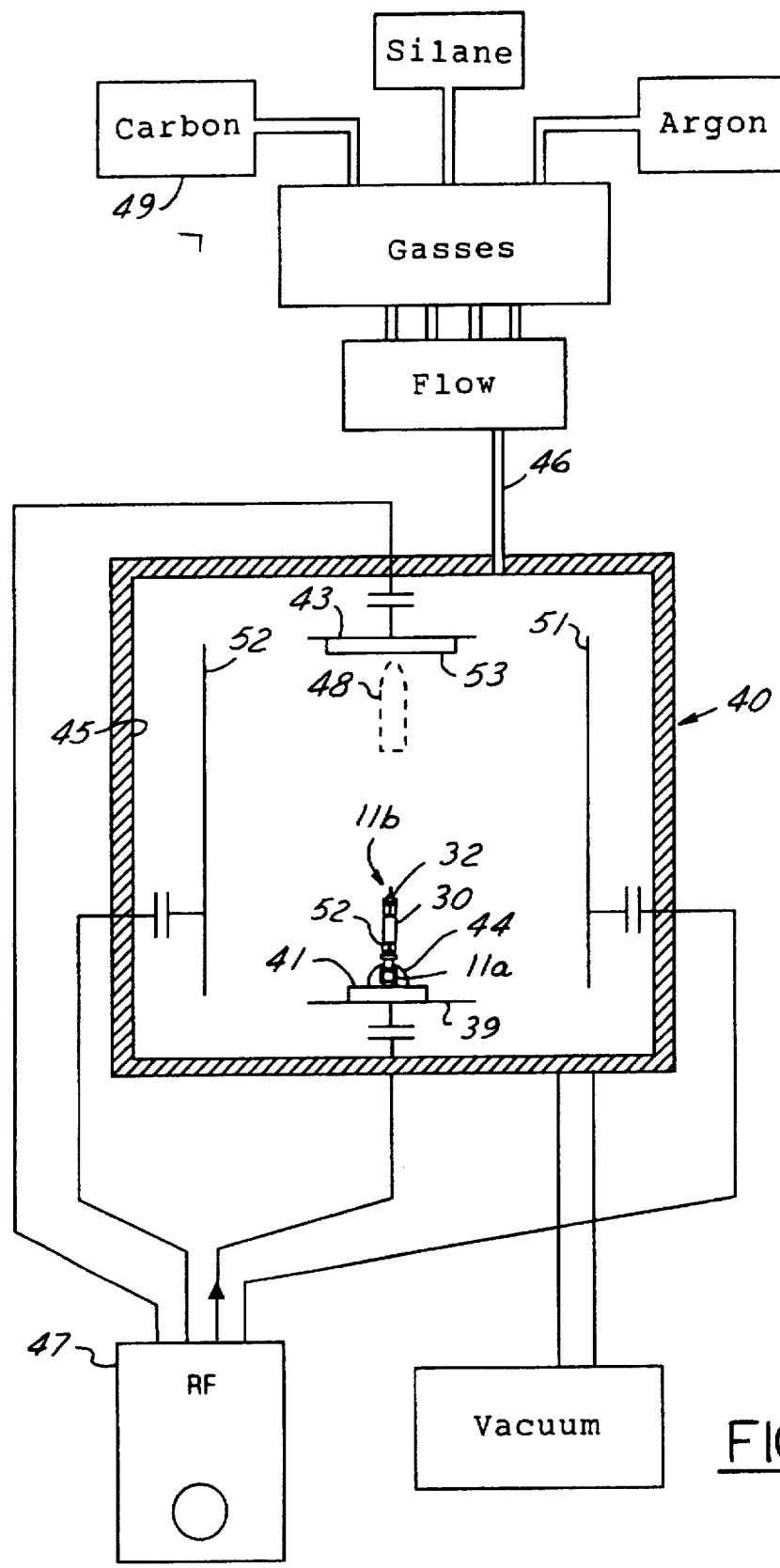
FIG. 3 is a schematic illustration of the enhanced plasma vapor deposition apparatus and of the manner of coating the valve pintle in accordance with this invention.

A preferred form of fuel injector 10 is shown in FIG. 1, which has a needle 11 that is movable along an axis 12 to open and close an injection aperture 13 at the end of a fuel cup 14 forming part of the valve body 15. One end of the needle is attached to an armature element 16 which is normally biased by a mechanical spring 17 to move the needle 11 to an aperture 13 closing position.

Pressurized fuel 18 is placed in normal communication with the fuel cup 14 by passing from an inlet 19 through a screen 19a, through a spring chamber 20, through opening 21 of element 16 and thence through openings 22 to the exterior of element 16, and finally around the pentagonal sides 23 of the needle lands 24. To open the aperture, a solenoid coil 25 is energized to force element 16 against the spring 17 and move the pintle 26 to an open position with respect to aperture 13. Suitable wiring 27 connects to the coil by way of a connector terminal 28. The pintle is cyclically opened and closed within a time period of 0.5–1.5 milliseconds, and the inertia of such rapid movement results in high impact stresses at the valve body seat 29 resulting from needle tip contact.

As shown in FIG. 2, the needle 11 is formed of a hardened and corrosive resistant steel alloy, such as 440 stainless steel;

it has contact surfaces 30 (corners of pentagonal shaped lands 24) which slide in contact with the interior cylindrical surface 31 of the valve body 15. The needle 11 also has an annular tip surface 32 (which may be conical) formed on the tip of the pintle 33 of the needle which contacts the interior seat surface 29 of the valve body 15 with an impact force (when urged by spring 17 to close the aperture 13 along axis of such seat 29). When coil 25 is energized, the electromagnetic force operates on the armature element 16 to pull the needle 11 away from the seat 29 a distance of 10–260 micrometers, depending on the injector type.

Such contact surfaces 30 and 32 can experience excessive wear (galling, abrasion, surface fatigue) in the absence of a liquid lubricant such as will be experienced with flexibly fueled engines utilizing propane gas, natural gas, gasoline or diesel fuel with a low sulfur content. This will occur in spite of the valve body being usually comprised of 440 stainless steel. The sliding contact surfaces 30 without the coating of this invention, may first experience galling when the injector is used over a reasonable period of time. Such galling may cause surfaces 30 to cease up against surface 31 of the valve body, causing the injectors to stop functioning. Frictional wear may be rapid enough for such uncoated surfaces to prevent ceasing and eventually cause the normal diametrical clearance between surfaces 30 and interior surface 31 (25 microns) to increase to about 15 microns over a period of use that is roughly equivalent to 10,000–13,000 vehicular miles or 13 million cycles of the injector.

Since the injector needle is typically actuated to have a cycle time period of 0.5–1.5 milliseconds and such cycles are continuously repeated, high impact stresses will be created in seat surface 29 as a result of aperture closing contact therebetween. Such impact stresses can be in the range of 60,000–200,000 psi. The initial contact area of conical surface 32 with conical seat 34 is never perfect and results in localized areas that upon initial contact can cause the stress to rise to the yield point of the body or needle material (i.e. about 200,000 psi for steel). However, during constructive break-in use, the metal at such localized contact areas will deform to bring down the stress level to about 70,000 psi and stay at such levels with little or no frictional wear. Without the coating of this invention at such stressed areas, the surfaces would suffer from material fatigue and deformation that may allow excessive fuel to be injected through the aperture 13. The dynamic flow rate of the fuel can deviate off target by as much as 20%.

Surfaces of at least one of the needle or the valve body is provided with an ion implanted stabilized amorphous carbon-based coating having low internal stresses and low friction when subjected to a humid condition and is stabilized by the presence of up to 30% by weight of a carbide forming material selected from the group of silicon, titanium, and tungsten. As shown in FIG. 3, the surfaces 30 and 32 of only the needle valve pintle are preferably coated to a thickness of 1–10 micrometers. A capacitively coupled parallel plate RF driven plasma reactor 40 may be used to effect both etching cleaning as well as coating of such surfaces. The reactor is advantageously used with a low pressure plasma enhanced chemical vapor deposition technique.

The needle 11 is desirably degreased prior to being subjected to the etching and coating technique in the RF driven plasma reactor. Such degreasing may be carried out by the use of soap, (KOH) and water acetone rinse, nitric acid etch and alcohol. The needle 11 is positioned with one end 11a of the needle on an RF powered fixture, such as cathodic electrode pedestal 41 of the RF apparatus, and the opposite end 11b of the needle valve is exposed to allow the plasma to envelope it and is preferably positioned to point generally toward the anoidic electrode 43. Any surfaces of the needle valve (i.e. surface 42) that are not to be coated or treated are usually masked by use of a membrane 44 as shown in FIG. 3.

After the chamber 45 has been evacuated to a system based pressure of about $4.0 \times 10^{-6}$ torr or less, an inert gas, such as argon, may be admitted to the chamber through gas inlet 46, while RF power from source 47 is directed to the substrate cathode electrode 41. This generates a negative bias voltage of 100–500 volts relative to the plasma which draws ions from the plasma and accelerates them to the needle valve pintle which is in conductive contact with the cathode electrode. Chemically inert argon ions dislodge other atoms of the steel pintle, thereby further cleaning all of the surfaces of the valve pintle by etching, including surfaces 30 and 32.

Deposition of the coating is then commenced by introducing a carbon coating precursor gas 49 in the form methane, acetylene, propane, butane, pentane or pentene, as the flow of inert gas is stopped, through inlet 46. At the same time a coating stabilizing material is also ion deposited along with the carbon ions. Side electrodes 50, 51 may be used to control the degree of negative potential as well as the field of the plasma 48. The plasma will have a wrap around effect to coat most of the surfaces the needle even though some of the surfaces a the needle are blind (i.e. surface 52) to the direction from which the ions are emanating from. When silicon is selected as the stabilizing material, tetramethyl silane or diethyl silane is also introduced as a gas to the plasma along with the carbon depositing gas. When titanium or tungsten is selected as the stabilizing material, a solid titanium or tungsten piece 53 is placed on a cathode electrode as a magnetron sputter target powered by a separate supply, to sputter ions of the titanium or tungsten into thy plasma for impregnating the amorphous carbon deposit with such stabilizing material 54. The ions implant into the surface of the valve pintle with an energy of about 50–00 electron volts per carson atom. Control parameters for the ion implantation apparatus, usually comprise; 10–200 metric pressure and RF power to produce a 25–1000 volt bias.

The presence of a carbide former in the form of silicon, titanium or tungsten will affect the carbon coating 55 by (i) preserving coating's low friction (less than 0.1 in humid conditions) without degrading and preserving the hardness of the coating which ranges from 12 to 20 Gprs, (ii) increasing the durability of the amorphous carbon, and (iii) permitting a thicker carbon coating with low internal stresses so that the coating does not self destruct.

Figure 4:
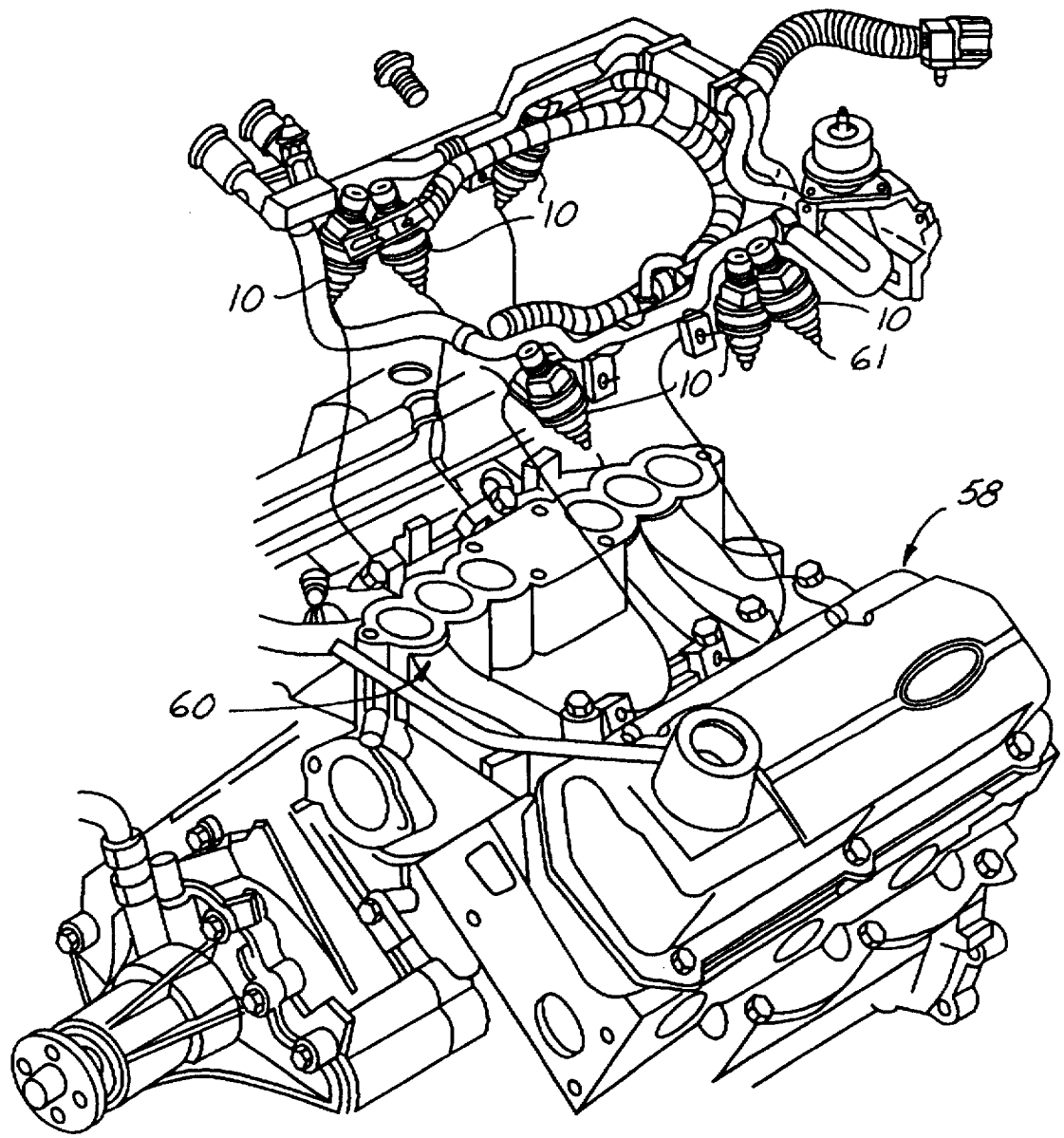
FIG. 4 is a schematic exploded view of an internal combustion engine illustrating the use of the fuel injectors therein.

Such technical features of the coating provide a surprising improvement in the operating life of a fuel injector when the contact surfaces (and/or the surfaces against which such contact surfaces bear) are ion implanted with a stabilized amorphous carbon based coating 55 in a thickness 56 of at least 1–10 μm and the presence of a stabilizing carbide-forming material in an amount of up to 300 by weight of the coating. When the needle 11 is repeatedly actuated, as a result of injector used in an I.C. engine 58 as shown in FIG. 4, subjecting the valve coated surfaces to sliding contact movement at within a cycle time of 0.5–1.5 milliseconds for each reciprocation and needle tip impact stresses of 70,000–200,000 psi, while such actuation is carried out in the absence of lubricious fuel at the coated surfaces, wear at surfaces 30 and 32 is significantly reduced by atomic transfer of the coating atoms to the mating surfaces during impact or sliding contact. The injectors 10 are usually mounted in the lower intake manifold 60 and positioned so that their tips are directing fuel just ahead of the engine intake valves (not shown). As a result, the operating life of the fuel injector can typically be extended by at least 50–150%. Wear will be considerably less even after 2,000–3,000 hours of injector use with gaseous fuel such as propane or natural gas.

While particular embodiments of the invention have been illustrated and described, it will be obvious to those skilled in the art that various changes and modifications may be made without departing from the invention, and it is intended to cover in the appended claims all such modifications and equivalents as fall within the true spirit and scope of this invention.

We claim:

1. A method of using an amorphous carbon-based coating to extend the operating life of a fuel injector valve having a needle operating within a valve body, comprising:

(a) providing an injector having a needle operating within a value body, the needle and valve body having steel surfaces subject to repeated impact and sliding friction contact over the operating life of the injector, at least one of said needle and valve body having its steel surfaces coated with an ion implanted stabilized amorphous carbon-based coating in a thickness of 1–10 micrometers, said coating having low internal stresses and low coefficient of friction independent of humidity, said coating being stabilized by the presence of up to 30% by weight of a carbide-forming material selected from the group of silicon, titanium, and tungsten; and (b) repeatedly cyclically actuating the fuel injector needle between open and closed valve positions using a cycle time of 0.5–1.5 milliseconds while subjecting the valve coated surfaces to sliding contact or impact stress, said actuation being carried out in the absence of lubricious fuel at said coated surfaces, whereby wear is significantly reduced by atomic transfer of coating atoms to mating surfaces during impact or sliding contact.

2. The method as in claim 1, in which the impact stresses are 60,000–200,000 psi and said coated surfaces provide a coefficient of frictional less than 0.04.

3. The method as in claim 1, in which the operating life of said fuel injector is extended by at least 50%.

4. The method as in claim 1, in which the needle and valve body are each comprised of stainless steel.

5. The method as in claim 1, in which the actuation of said fuel injector is provided by (i) a mechanical spring normally biasing the needle tip to a closed position and (ii) a solenoid device providing an electromagnetic field to retract the valve against the force of said spring, thereby providing an actuation cycle time in the range of 0.5–1.5 milliseconds.

6. The method as in claim 1, in which said repeated actuation results in little or wear after 13 million cycles of injection actuated use.

7. The method as in claim 1, in which said injector is uses to meter gaseous fuels while being actuated.

8. A method of making a fuel injector with an extended-life comprising:

(a) positioning a needle, having a needle tip at one end, on one electrode pedestal of a plasma enhanced vapor deposition apparatus, said needle tip pointing generally to an opposite polarity electrode of said apparatus exposing said needle to a plasma to be created with the other electrode, said needle having impact and sliding contact surfaces not all of which are exposed when viewed from a single direction, any surface of said needle that is not to be surface treated being masked;

(b) cleaning and etching at least the impact and sliding contact surfaces of said needle;

(c) while providing ionizing material to the electromagnetic field generated between an electrodes, carrying out said plasma enhanced vapor deposition to deposit an amorphous carbon coating in a thickness of 1–10 micrometers, said carbon coating being stabilized by the presence of up to 30% by weight of a carbide former with said steel, said carbide former being selected from the group of silicon, titanium and tungsten.

9. The method as in claim 8, in which step (c) is carried out so that the ions are directed by an electric field to wrap around said needle to coat all surfaces even though blind to one of the electrodes.

10. The method as in claim 8, in which the starting material for the ion stream, for depositing the amorphous carbon based coating, selected from the group methane acetylene, propane, butane, pentane and pentelene.

11. The method as in claim 8, the carbide former material stabilizing the amorphous coating is comprised of a tetramethyl silane or diethyl silane gas introduced along with the hydrocarbon gases of the starting material.

12. The method as in claim 8, in which titanium or tungsten is selected as the carbide-former, and solid titanium or tungsten is placed on a magnetic cathode and a voltage is applied to strip and sputter ions of said titanium or tungsten into said plasma for impregnating the amorphous carbon coating with said stabilizing material.

* * * * *